United States Patent [19]
Pisati et al.

[11] Patent Number: 5,912,582
[45] Date of Patent: Jun. 15, 1999

[54] BICMOS TRANSCONDUCTOR STAGE FOR HIGH-FREQUENCY FILTERS

[75] Inventors: Valerio Pisati, Bonasco; Roberto Alini, Stradella; Gaetano Cosentino, Catania; Gianfranco Vai, Pavia, all of Italy

[73] Assignee: STMicroelectronics S.r.l., Agrate Brianza, Italy

[21] Appl. No.: 08/866,889

[22] Filed: May 30, 1997

[30] Foreign Application Priority Data

May 31, 1996 [EP] European Pat. Off. ............. 96830311

[51] Int. Cl.⁶ .................. H03B 1/00; H03K 5/00; H04B 1/10
[52] U.S. Cl. ............ 327/551; 327/560; 327/563; 330/252
[58] Field of Search ................. 327/551, 558, 327/560, 561, 563, 103, 552, 557, 559, 65, 66, 89; 330/252, 253

[56] References Cited

U.S. PATENT DOCUMENTS

| | | | |
|---|---|---|---|
| 3,898,583 | 8/1975 | Shuey | 327/552 |
| 4,390,850 | 6/1983 | Davis et al. | 330/253 |
| 5,061,862 | 10/1991 | Tamagawa | 327/561 |
| 5,162,668 | 11/1992 | Chen et al. | 327/541 |
| 5,223,743 | 6/1993 | Nakagawara | 327/103 |
| 5,332,937 | 7/1994 | Castello et al. | 307/520 |
| 5,432,477 | 7/1995 | Nishiyama et al. | 327/563 |
| 5,596,289 | 1/1997 | Liu | 327/67 |
| 5,684,429 | 11/1997 | Sanwo et al. | 327/563 |

FOREIGN PATENT DOCUMENTS

| | | |
|---|---|---|
| 0 695 030 A1 | 1/1996 | European Pat. Off. |
| 2 672 748 | 8/1992 | France. |
| 3813532A1 | 11/1989 | Germany. |
| 56-102107 | 8/1981 | Japan. |
| 63-1768 | 8/1981 | Japan. |

*Primary Examiner*—Timothy P. Callahan
*Assistant Examiner*—An T. Luu
*Attorney, Agent, or Firm*—David V. Carlson; Seed & Berry LLP

[57] ABSTRACT

A BiCMOS transconductor differential stage for high frequency filters includes an input circuit portion having signal inputs and a pair of MOS transistors having their respective gate terminals corresponding to the signal inputs. The differential stage has an output circuit portion having signal outputs and a pair of bipolar transistors connected together with a common base inserted between the inputs and the outputs in a cascode configuration. The differential stage includes a switching device associated with at least one of the bipolar transistors to change the connections between parasitic capacitors present in the differential stage. The switching device also has at least one added bipolar transistor connected in a removable manner in parallel with the corresponding bipolar cascode transistor. In a variant differential stage, there are also provided respective added MOS transistors connected in parallel with the MOS transistors of the input circuit portion to change the ratio W:L of each of the MOS transistors.

15 Claims, 4 Drawing Sheets

BICMOS TRANSCONDUCTOR STAGE FOR HIGH-FREQUENCY FILTERS

TECHNICAL FIELD

The present invention relates to a BiCMOS Transconductor differential stage for high frequency filters, and more particularly, to transconductors for time-continuous pass-band filters which are monolithically integrated on a semiconductor.

BACKGROUND OF THE INVENTION

A transconductor is basically a voltage-controlled differential stage with transconductance. It is used to provide integrators incorporated in active filters but also to provide oscillators and circuits for the conversion of impedances.

In recent years there have been proposed various techniques for providing time-continuous integrated filters. A technique which has gained acceptance as the most effective for high frequency applications is one using a BiCMOS transconductor stage as a basic block of the filter.

Inside a BiCMOS transconductor filter an open-loop voltage-current conversion is performed, and a so-called non-dominant pole of the filter is not limited by the unit frequency gain of an operational amplifier circuit portion of the filter. This is an advantage over filters provided in conformity with CMOS technology.

However, transconductor filters also have a shortcoming of being particularly sensitive to parasitic capacitors as a result of their open-loop operating mode. This limits the amplitude of their pass band, particularly at high frequencies.

A transconductor filter which seeks to obviate this limitation in the pass band is disclosed in U.S. Pat. No. 5,332,937.

The solution disclosed in this U.S. patent, although advantageous in some ways, does not allow band amplitudes capable of meeting current requirements.

In some applications linked to a reading of information in computer mass memories, e.g., in the reading of a hard disc drive, there is a need to further extend a pass band of a signal to be filtered.

A filter with an improved frequency performance is disclosed in the article "Tunable BiCMOS Continuous-Time Filter for High Frequency Application," *IEEE Journal of Solid State Circuits*. December 1992, page 1905. The article proposes varying a transconductance gm of a transconductor filter depending on the requirements of the field of application. The article considers variations in the transconductance gm between one and four.

An analysis made in this article shows that there exists an upper limit to the amplitude of an input signal applicable to a transconductor stage of the filter. Beyond this limit the linearity characteristics of the stage are seriously impaired.

The solution disclosed in the above mentioned article does not meet current application requirements.

SUMMARY OF THE INVENTION

According to principles of the present invention, a transconductor differential stage for high frequency filters is provided having structural and functional characteristics for increasing the pass band of time-continuous filters while exceeding the limitations and shortcomings of filter devices provided in accordance with the prior art. The differential stage includes an input circuit portion having signal inputs and a pair of MOS transistors having their respective gate terminals corresponding to the above-mentioned input signals. The differential stage also includes an output circuit portion having output signals and a pair of bipolar transistors connected together with a common base and inserted between the input circuit portion and the output circuit portion in a cascode configuration.

The characteristics and advantages of the stage in accordance with the present invention are set forth in the description of an embodiment thereof given below by way of non-limiting example with reference to the annexed drawings.

DETAILED DESCRIPTION

Figure 1:
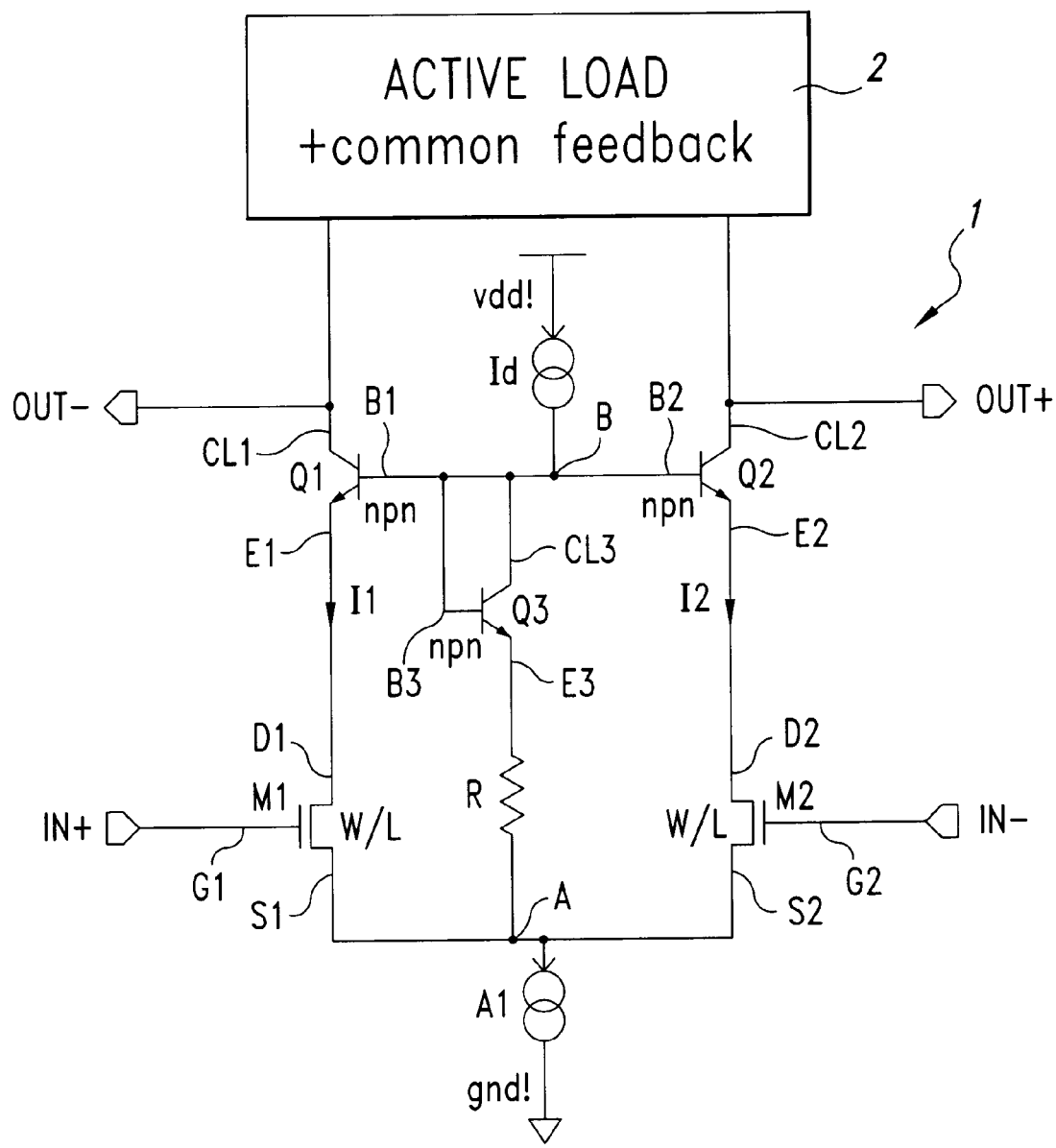
FIG. 1 shows a diagrammatic view of the basic structure of a transconductor differential stage provided in accordance with the prior art.

To better understand the difficulties encountered in seeking to improve the performance of time-continuous transconductor filters it is useful to refer to the annexed FIG. 1 in which is shown a basic diagram of a conventional differential stage which can be incorporated into a pass-band filter.

A differential stage 1 is powered between a first reference supply voltage Vdd and a second reference voltage, for example, a signal ground GND. In addition, the differential stage 1 is implemented by using a so-called mixed BiCMOS technology because it includes both bipolar transistors and MOS transistors.

The differential stage 1 has an input circuit portion made up of a pair of N-channel MOS transistors M1 and M2. The transistor M1 has a drain terminal D1, a gate terminal G1, and a source terminal S1. The transistor M2 has a drain terminal D2, a gate terminal G2, and a source terminal S2. The transistors M1 and M2 have their respective source terminals S1 and S2 connected in common to constitute a circuit node A.

The gate terminal G1 of the transistor M1 is a non-inverting input IN+ for the differential stage 1. The gate terminal G2 of the transistor M2 is an inverting input IN− for the differential stage 1.

Between the circuit node A and the ground GND there is a current generator A1.

The differential stage 1 also has an output circuit portion made up of a pair of bipolar transistors Q1 and Q2 of the npn type. The transistor Q1 has a collector CL1, a base B1, and an emitter E1. The transistor Q2 has a collector CL2, a base B2, and an emitter E2. The respective bases B1 and B2 of the transistors Q1 and Q2 are connected together in a common node B which is powered by the first reference supply voltage Vdd through a bias current generator Id.

The transistors Q1 and Q2 are inserted in the differential stage 1 in a so-called cascode configuration. The transistors Q1 and Q2 have their respective emitters E1 and E2 connected, respectively, to the drain terminals D1 and D2 of the transistors M1 and M2.

The collectors CL1 and CL2 of the transistors Q1 and Q2 constitute output terminals for the differential stage 1 and are indicated respectively by OUT– and OUT+. Each of the collectors CL1 and CL2 is connected to an active load 2.

The structure of the differential stage 1 is completed by a third transistor Q3 of the bipolar npn type having a base B3 connected to the bases B1 and B2 and an emitter E3 connected to the node A through a resistive element R. The third transistor Q3 has a collector CL3 connected to the bias current generator Id. The base B3 and the collector CL3 of the transistor Q3 are connected together to give this transistor a diode configuration.

The transistors M1 and M2 are biased in a linear operation zone and thus bring about a linear conversion from voltage to current to determine a value of a transconductance gm of the differential stage 1.

The resistance value of the resistive element R causes a drain-source voltage drop Vds for both the transistors M1 and M2. Under conditions of linearity the transistors M1 and M2 are traversed by currents I1 and I2 whose value is given by the following equation:

$$I1=I2=Cox[(Vgs-Vt)Vds-(Vds)^2/2]W/L$$

where Vgs is the gate-source voltage drop of the transistors M1 and M2, Vt is the threshold voltage thereof, and W and L are, respectively, the amplitude and the width of the channel region, and $\mu$ and Cox are known parameters of each transistor.

If a differential signal is applied to the inputs IN– and IN+ of the differential stage 1 it is possible to calculate the value of the transconductance gm of the differential stage 1 as an incremental ratio of the variation of a current Iout at the output to the variation of an input voltage Vin=Vgs(M1)–Vgs(M2). Accordingly—

$$gm=\delta Iout/\delta Vin=\mu Cox\ Vds\ W/L.$$

A pole on which the pass band of the pass band filter depends is correlated with the transconductance gm and in particular is given by the ratio gm:C where C is the value of an equivalent capacitance of the differential stage 1.

Figure 3:
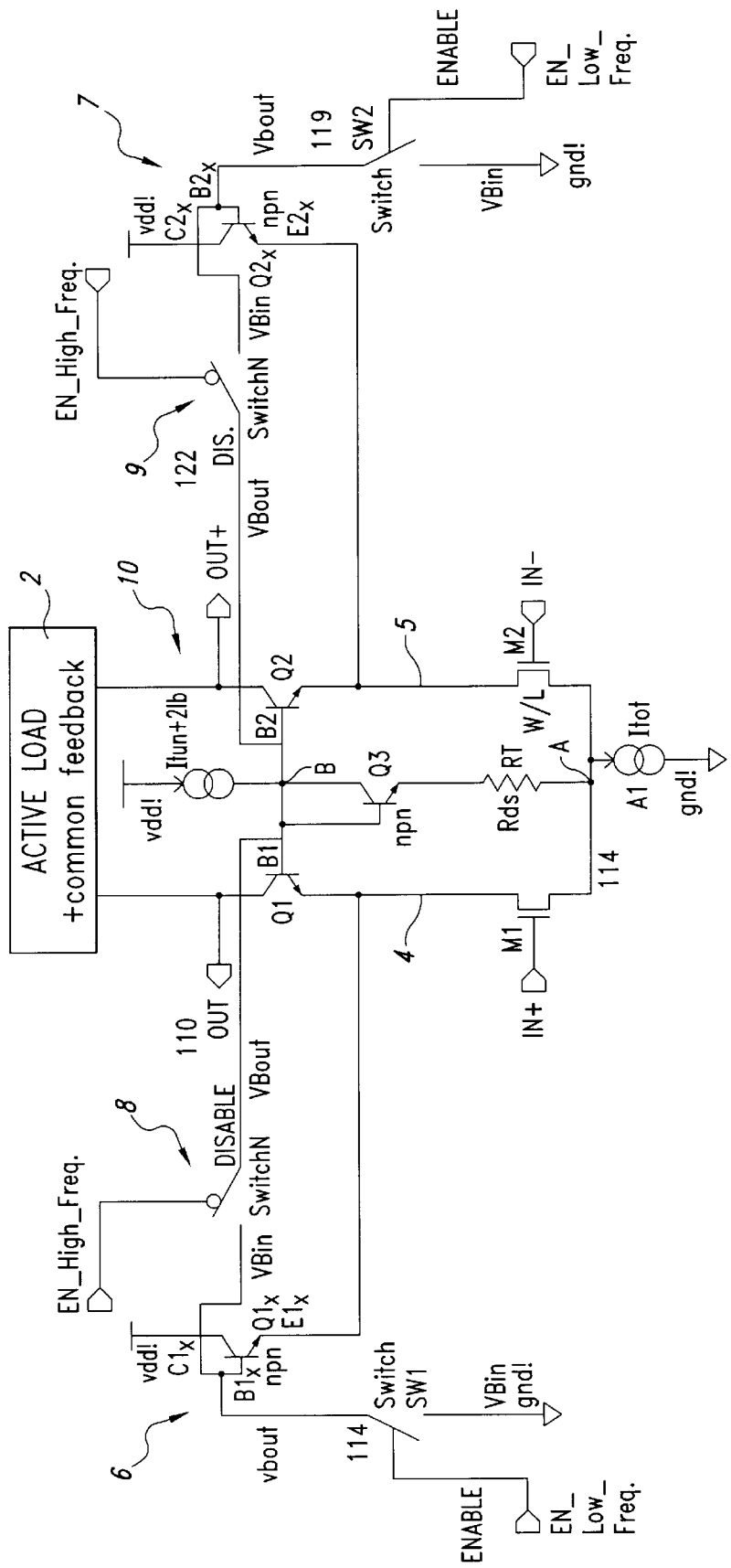
FIG. 3 shows a diagrammatic view of a transconductor differential stage incorporating a switching circuit in accordance with an embodiment of the present invention.

With reference to FIG. 3, indicating as a whole and schematically a transconductor differential stage 10 is provided in accordance with an embodiment of the present invention in conformity with BiCMOS technology.

The differential stage 10 includes a differential cell corresponding to the structure discussed above with reference to FIG. 1, and similar elements have been given similar reference numerals. Accordingly, there is now omitted a detailed description thereof to avoid complicating the following discussion of the present disclosure.

The differential stage 10 comprises two principal circuit branches, a first branch 4 and a second branch 5, one for each of the two differential inputs IN+ and IN–.

Advantageously in accordance with an embodiment of the present invention, the differential stage 10 comprises two identical switching devices 6 and 7, each associated with one respective branch 4 or 5 of the differential stage 10. Each of the switching devices 6 and 7 operate in the same manner.

The switching device 6 can modify the connections between parasitic capacitors present in the differential stage 10. For this purpose the switching device 6 comprises a microswitch SW1 normally open and driven to close by a signal ENABLE_LOW_FREQ.

The microswitch SW1 is inserted between the node B of the differential stage 10 and the ground GND. It is recalled that the node B coincides with the point of connection between the bases B1 and B2 of the transistors Q1 and Q2.

Figure 2:
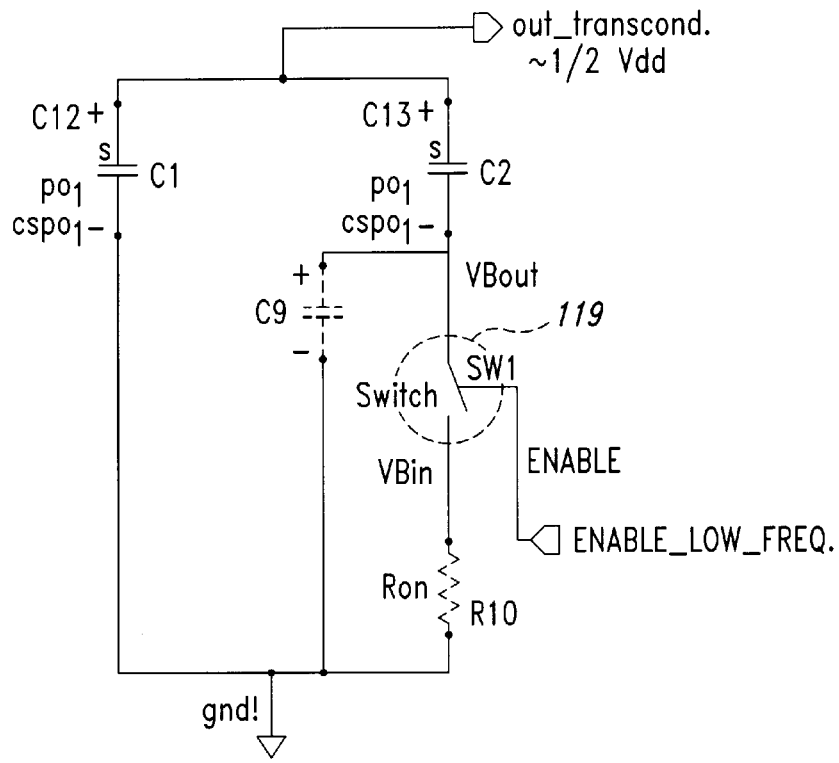
FIG. 2 shows a detail of a switching circuit provided in accordance with an embodiment of the present invention with a transconductor differential stage.

FIG. 2 shows a detail of the switching device 6 in which are also indicated some capacitors present in the differential stage 10 opposite various components.

In particular, two capacitors C1 and C2 are connected to the outputs of the differential stage 10 and have a relatively high value while a capacitor Cj corresponds to a parasitic capacitor of the transistor Q3.

The value of an equivalent capacitance seen at an output terminal of the differential stage 10 with the contribution of these capacitors can be calculated by the following formula.

$$Ceq=Cj*C2/(Cj+C2)+C1$$

A resistance Ron is indicated in series with the micro switch SW1 to represent the intrinsic resistance of the switch SW in the closing state. It is important that this resistance Ron be as low as possible.

Figure 2A:
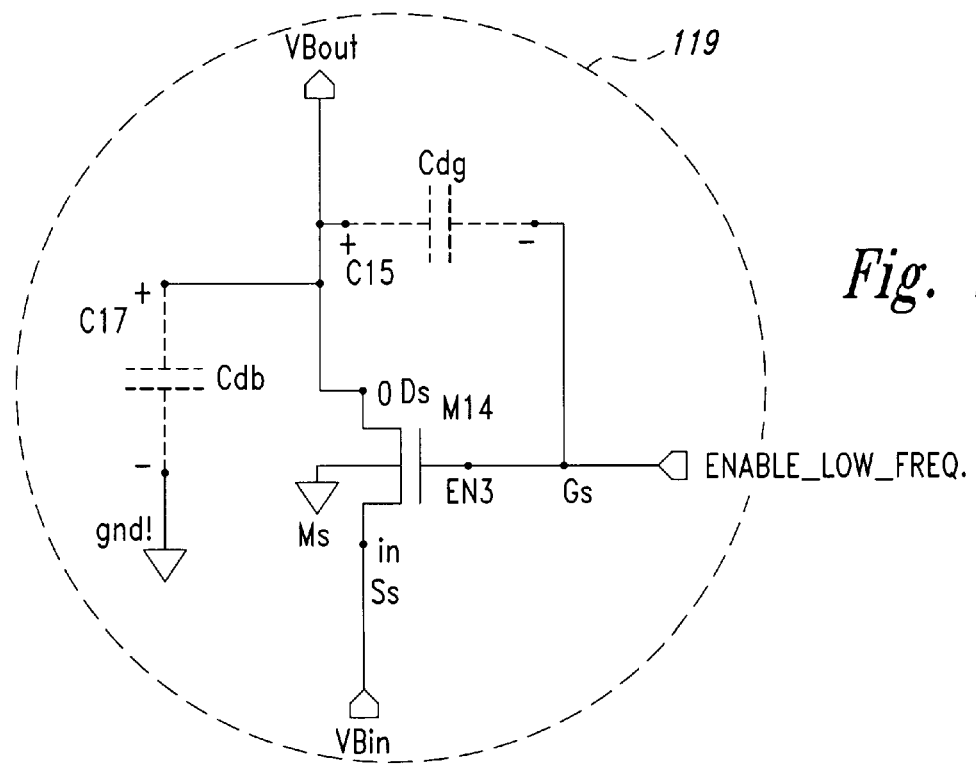
FIG. 2a shows an enlarged scale view of a detail of the circuit of FIG. 2.

FIG. 2a shows in enlarged scale a possible embodiment of the switch SW1 which is proposed as an N-channel MOS transistor Ms with a control or gate terminal Gs on which is applied a signal ENABLE_LOW_FREQ. The transistor Ms is chosen with a large size to have a low internal resistance Ron but this results in a shortcoming due to the presence of the capacitors C1 and C2.

Indeed, the transistor Ms has a drain terminal DS connected to the node B and a source terminal Ss connected to the ground GND. Between the drain terminal Ds and the gate terminal Gs there is a parasitic capacitor Cdg while between the drain terminal Ds and the bulk of the transistor Ms there is a second parasitic capacitor Cdb.

The presence of these parasitic capacitors in the switch SW1 may limit its effectiveness.

To avoid this possible shortcoming, the present invention proposes to insert in the switching device 6 a bipolar transistor Q1x connected in parallel with the transistor Q1 of the first branch 4 of the differential stage 10.

Specifically, the switching device 6 associated with the first branch 4 of the differential stage 10 shown in FIG. 3 comprises the transistor Q1x of the npn type connected in a removable manner in parallel with the transistor Q1. The transistor Q1x has a base B1x, a collector C1x, and an emitter E1x. Between the base B1x of the transistor Q1x and the ground GND is inserted the switch SW1.

In like manner the switching device 7 associated with the second branch 5 of the differential stage 10 comprises a bipolar transistor Q2x of the npn type connected in a removable manner in parallel with the transistor Q2. The transistor Q2x has a base B2x, a collector C2x, and an emitter E2x. Between the base B2x of the transistor Q2x and the ground GND is inserted the switch SW2.

Advantageously, in each of the switching devices 6 and 7 there is also provided a second microswitch indicated by the reference numbers 8 and 9, respectively, which are inserted in the connection between the base terminals of the transistors Q1 and Q1x and Q2 and Q2x, respectively.

Each second microswitch 8 and 9 is normally open and is driven to close by a signal ENABLE_HIGH_FREQ negated. The second microswitches 8 and 9 can be provided by small transistors so as not to introduce additional parasitic components.

When the second microswitches 8 and 9 are driven to close each transistor Q1 and Q2 of the differential stage 10 is connected in parallel with a like transistor Q1x and Q2x, respectively. Under these conditions the value of the transconductance gm decreases and a second equivalent pole of the differential stage 10 is shifted to a lower frequency because of a parasitic capacitor introduced by each of the emitters E1x and E2x of the added transistors Q1x or Q2x, but at the same time the pole of the differential stage 10 given by the ratio gm:C falls because of the reduction of the transconductance gm.

This fact can change a so-called phase excess of the differential stage 10 and, to keep any phase excess limited, there could be provided a stage with a low nominal gain, i.e., a gain of the type controlled in its variations with respect to the nominal gain. In this manner are eliminated as much as possible the changes in a gain A with which the phase excess is linked.

These problems were faced in European patent application no. 94830390.4 which is incorporated herein by way of reference. In any case, changes in phase excess called for in the present invention would occur only when the differential stage 10 operates at a low frequency and therefore does not negatively influence the high-frequency performance of the differential stage 10 in accordance with the present invention.

Basically, the structure of the differential stage 10 in accordance with the present invention allows for changing the value of the transconductance gm and increasing the tuning range without impairing the frequency performance of the differential stage 10.

It is also possible to avoid switchings on the input signal and it is much easier to control the value of the transconductance gm through a mere replication of the differential stage 10.

In a different embodiment falling within the scope of the present invention and which is now discussed with reference to FIG. 4, it is possible to change the transconductance gm by inserting respective MOS transistors in parallel with the transistors M1 and M2 of the input circuit portion of the differential stage 10.

In this manner the ratio W:L of each of the transistors M1 and M2 is changed by the coupling in parallel of at least one MOS transistor.

In order to avoid introducing switches on the inputs IN+ and IN– the added MOS transistors can be started or stopped by means of a current mirror structure.

Figure 4:
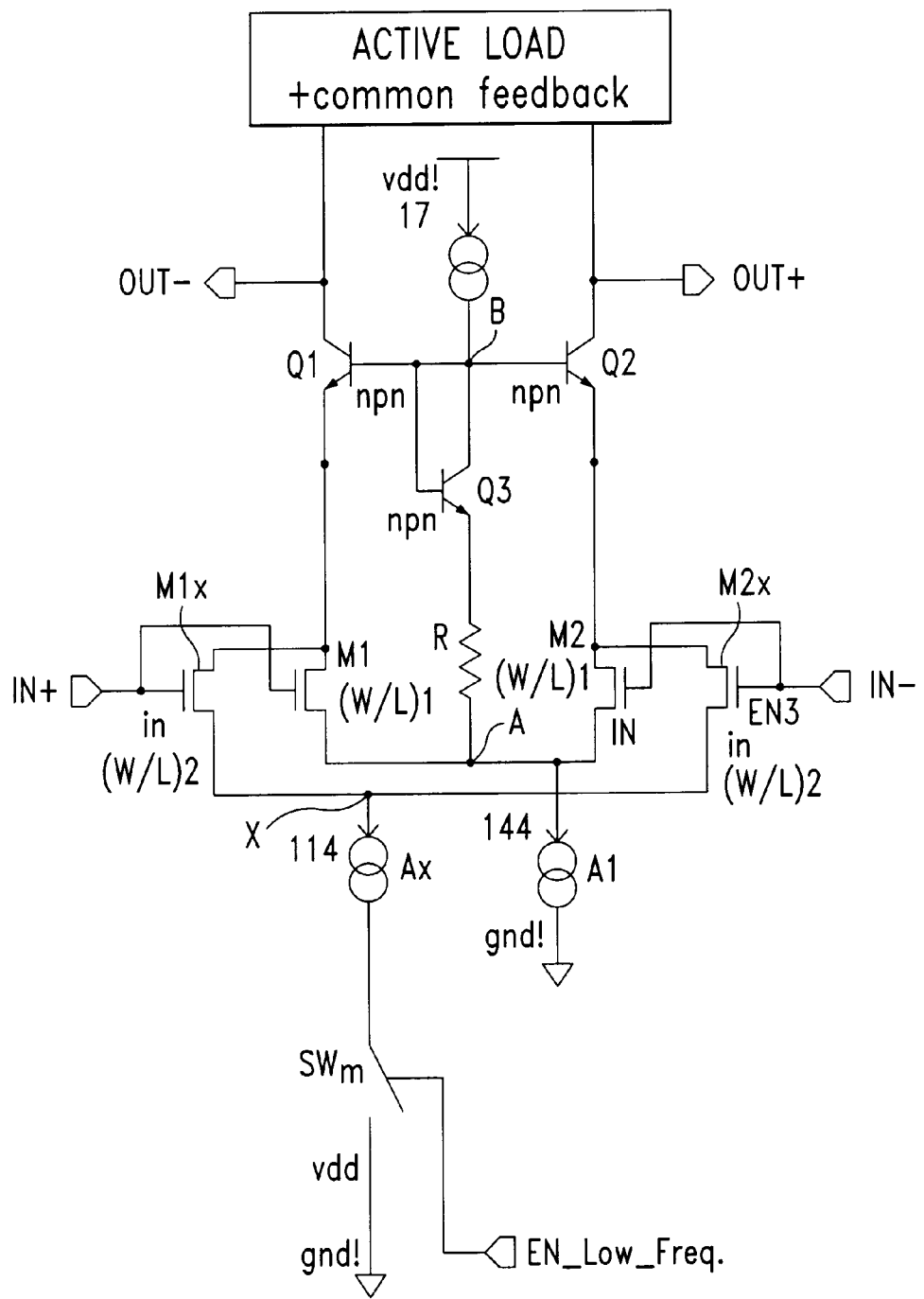
FIG. 4 shows a variant embodiment of the transconductor differential stage in accordance with the present invention.

With particular reference to FIG. 4, a MOS transistor M1x is connected in parallel with the transistor M1, and a MOS transistor M2x is connected in parallel with the transistor M2. Each of the transistors M1x and M2x has a drain terminal, a source terminal, and a gate terminal.

The respective source terminals of the transistors M1x and M2x are connected together at a common node X which is coupled to the ground GND through a series connection of a current generator Ax and a microswitch SWm. The current generator Ax is switched on when the microswitch SWm is switched on. The microswitch SWm is controlled by the signal ENABLE_LOW_FREQ.

The microswitch SWm can be provided by a small transistor if the current generators A1 and Ax are provided in conformity with MOS technology but otherwise a larger transistor would be needed if the current generators A1 and Ax are in conformity with bipolar technology.

If gm1 indicates the transconductance associated with the transistors M1 and M2 the transconductance associated with the added transistors M1x and M2x can be designated by gm2.

When the current generator Ax is switched on, it is possible to show that the transconductance of the differential stage 10 is given by the sum of the values gm1 and gm2. This happens with high-frequency applications, i.e., for high values of gm/C.

In low frequency operation on the other hand the transconductance of the differential stage 10 corresponds only to gm1 since the current generator Ax is switched off.

This embodiment of the invention provides for two different transconductance values depending on the requirements of the application.

In conclusion, the differential stage in accordance with the present invention makes it possible to adapt the band amplitude of the signal to be filtered while ensuring filtering linearity.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A differential stage for a high frequency filter comprising:

an input circuit portion including first and second MOS transistors, a gate of the first MOS transistor and a gate of the second MOS transistor forming signal inputs for the differential stage;

an output circuit portion including first and second bipolar transistors having respective bases connected together at a circuit node, a collector of the first bipolar transistor and a collector of the second bipolar transistor forming signal outputs for the differential stage;

a first switching device coupled to the first bipolar transistor, the first switching device having a third bipolar transistor selectively coupled to the first bipolar transistor; and a second switching device coupled to the second bipolar transistor, the second switching device having a fourth bipolar transistor selectively coupled to the second bipolar transistor.

2. The differential stage of claim 1 wherein the third bipolar transistor is coupled to the first bipolar transistor according to an enablement signal and the fourth bipolar transistor is coupled to the second bipolar transistor according to the enablement signal.

3. The differential stage of claim 2, further comprising:

a first switch receiving a first enablement signal and being connected to the first switching device to couple the circuit node to a ground voltage reference in response to the enablement signal; and a second switch receiving the first enablement signal and being connected in the second switching device to couple the circuit node to the ground voltage reference in response to the enablement signal.

4. The differential stage of claim 3 wherein the first switch is an n-channel MOS transistor having a gate terminal receiving the enablement signal and the second switch is an n-channel MOS transistor having a gate terminal receiving the enablement signal.

5. The differential stage of claim 3, further comprising:

a third switch receiving a second enablement signal and being coupled between the circuit node and a base of the third bipolar transistor to couple the third bipolar transistor to the first bipolar transistor in response to the second enablement signal; and a fourth switch receiving the second enablement signal and being coupled between the circuit node and the base of the fourth bipolar transistor to couple the fourth bipolar transistor to the second bipolar transistor in response to the second enablement signal.

6. The differential stage of claim 1, further comprising:

a third MOS transistor having a source and being connected to the first MOS transistor;

a fourth MOS transistor having a source and being connected to the second MOS transistor; and wherein the sources of the third and fourth MOS transistors are connected together to a current generator and a fifth switch, the fifth switch being controlled to selectively switch on the third and fourth MOS transistors to control a transconductance of the differential stage.

7. A BiCMOS transconductor differential stage for high frequency filters including an input circuit portion having signal inputs and a pair of MOS transistors having respective gate terminals corresponding to said signal inputs and an output circuit portion having signal outputs and a pair of bipolar transistors connected together with a common base in a circuit node and inserted between said inputs and said outputs in a cascode configuration, the differential stage comprising a switching device associated with at least one of said bipolar transistors to change minimize or to eliminate the parasitic capacitance presented in the differential stage with said switching device comprising in addition at least one added bipolar transistor connected in a removable manner to the corresponding bipolar cascode transistor, the switching device including a normally open first microswitch which is driven in a closing state by an enablement signal, said first microswitch being inserted between said circuit node and a reference voltage.

8. The BiCMOS transconductor differential stage of claim 7 wherein said first microswitch is an N-channel MOS transistor with control or gate terminal on which is applied the enablement signal.

9. The BiCMOS transconductor differential stage of claim 8 wherein said N-channel MOS transistor is chosen with large size to have low internal resistance.

10. The BiCMOS transconductor differential stage of claim 7 wherein the switching device also comprises a second microswitch inserted between said circuit node and the base terminal of said added bipolar transistor.

11. The BiCMOS transconductor differential stage of claim 10 wherein the first microswitch is inserted between the base terminal of the added bipolar transistor and the reference voltage.

12. The BiCMOS transconductor differential stage of claim 7, further comprising a switching device for each bipolar cascode transistor.

13. The BiCMOS transconductor differential stage of claim 7, further comprising respective added MOS transistors connected to the MOS transistors of the input circuit portion to change the ratio W:L of each of the input transistors.

14. The BiCMOS transconductor differential stage of claim 7 wherein respective source terminals of the added MOS transistors are connected together in a common node which is connected to a ground through a series connection of a current generator and a microswitch.

15. A pass-band filter of a second order comprising at least one transconductor stage in accordance with claim 7.

* * * * *